United States Patent [19]

Heuber et al.

[11] 4,027,176

[45] May 31, 1977

[54] SENSE CIRCUIT FOR MEMORY STORAGE SYSTEM

[75] Inventors: Klaus Heuber, Boeblingen; Wilfried Klein, Holzgerlingen; Knut Najmann, Gaertringen; Rolf Remshardt, Boeblingen; Siegfried K. Wiedmann, Stuttgart, all of Germany

[73] Assignee: International Business Machines Corporation, Armonk, N.Y.

[22] Filed: Nov. 26, 1975

[21] Appl. No.: 635,539

[30] Foreign Application Priority Data

Dec. 19, 1974 Germany ............................ 2460146

[52] U.S. Cl. .............................. 307/355; 307/238; 307/291; 307/DIG. 3; 340/173 FF
[51] Int. Cl.² .................... H03K 5/20; H03K 3/286
[58] Field of Search ...... 307/235 R, 235 F, DIG. 3, 307/238, 291; 340/173 AM, 173 FF, 173 R

[56] References Cited

UNITED STATES PATENTS 3,617,770  11/1971  Norton et al. .................. 307/235 F
3,621,301  11/1971  Tomczak ............................ 307/290

Primary Examiner—John Zazworsky
Attorney, Agent, or Firm—Francis J. Thornton

[57] ABSTRACT

This teaches a sense circuit for an integrated memory storage system in which the storage cell output is detected by a differential amplifier, controlling a flip-flop, serving as a latch, having load elements which also function as the load elements of the latch to ensure an optimum power and speed product. The latch can be coupled to an output driver circuit through a current switch which shares common elements with the latch to assure that the latch remains symmetrical even when used with an output driver having asymmetrical control.

12 Claims, 3 Drawing Figures

SENSE CIRCUIT FOR MEMORY STORAGE SYSTEM

BACKGROUND OF THE INVENTION

1. Field of the Invention

The invention relates generally to a sense circuit for a memory storage system and more particularly to a sense circuit in which a bit line pair, supplying the sense signal as a differential voltage, is connected to the control inputs of a differential amplifier whose outputs control the state of a flip-flop serving as a latch circuit.

2. Description of the Prior Art

Present memory systems and in particular those used for computer applications, are manufactured using integrated semiconductor technology, and as such comprise a plurality of sepcifically organized memory storage cells formed in monolithic semiconductor chips.

Such individual storage cells can be, for example, cross-coupled flip-flops which store information by means of the two switching states they can adopt. Such cross coupled storage cells are integrated in the semiconductor chip and information is written into or read out of the storage cells being accessed, by parallel bit lines connected to the individual storage cells and by word lines arranged perpendicularly to the bit lines.

In a word organized read/write memory, for example, two bit lines are provided for each storage cell in a column, and one word line is associated with each row. As the stored information is read or sensed, the memory system is controlled in such a manner that one or several storage cells emit a read signal identifying their respective switching stage. Generally, the storage cells supply the read signal via a bit line pair connected to the nodes of the storage cells which are made up of cross-coupled flip-flops. The read signal thus consists of a bit line pair. This read signal is sensed, amplified, and transferred to a suitable evaluation circuit.

Many read or sense circuits for such storage systems are known to the prior art. The circuit system used in each case depends, of course, on the memory employed, its organization and the kind of storage cells used, and is adapted to the requirements of the respective application.

In integrated systems, it is common to supply the read signal in the form of a differential voltage on a bit line pair to read amplifiers consisting of two transistors connected as a differential amplifier. The bases of these two transistors are connected to the output signal derived from the read signal is taken from one or both collectors of the two transistors. A read circuit of this kind is described, for example, in "IBM Technical Disclosure Bulletin" Vol. 10, No. 12, May 1968, pp. 1198 and 1999. Many read circuits fitting this description in principle are known from the art and have been used in core storage matrices, as may be seen, for example, in the commonly assigned U.S. Pat. No. 3,617,770 to D. E. Norton et al. issued Nov. 2, 1971.

In integrated storage systems, the amplified read signal obtained is fed to the output of the semiconductor chip. The signal is processed further in storage control circuits outside the semiconductor chip. In up-to-date semiconductor arrangements it is necessary, however, to store the read signal on the semiconductor chip for a longer period of time, for example, for several write cycles, since the necessary control logic can be considerably simplified in this manner.

To effect this temporary storage, the output of the read amplifier is provided with a flip-flop type latch circuit which is integrated on the semiconductor chip.

As the read signals, temporarily stored on the semiconductor chip, have to be transferred at a predetermined time to control circuits outside the semiconductor chip for further processing, it is advisable for output driver circuits, connected to the latch circuit, to also be provided on the chip. In addition to accelerating the signal output, these output driver circuits serve the purpose of preventing control circuits, representing a relatively high load from adversely acting on the semiconductor chip.

Although known arrangements have yielded good results with regard to integration, switching speed, power requirements and noise rejection, they fall short of exacting present day requirements for higher packing densities, lower power dissipation and higher switching speeds.

SUMMARY OF THE INVENTION

Broadly speaking, the present invention is directed towards sense circuits and more particularly to a sense circuit which senses the stored information with a differential sense amplifier that controls a latch coupled to an output driver so that high operating speed, low power dissipation and a low noise signal rejection rate is achieved.

The present invention achieves these desirable results in a sense circuit in which the differential sense amplifier is an emitter-coupled transistorized current switch whose two collector load elements simultaneously form the collector load elements of the latch.

It is still a further feature of the invention to provide a sensing circuit in which the latch is a cross-coupled flip-flop and for each load element of the latch there is provided a shunt feed-back circuit controlled by the latch.

It is a further feature of the invention to provide a sensing circuit in which the output side of the latch co-acts with a further transistor to form an emitter-coupled current switch controlling an output driver, in which the further transistor is controlled by the output side of the latch.

It is still a further feature of the invention to provide voltage clamping elements in the feed-back circuit for setting the response threshold of the latch.

In summary, the sense circuit in accordance with the invention has the following advantages. The use of common load elements for both the latch circuit and differential sense amplifier ensures an optimum power/speed product. The symmetrical control of the flip-flop of the latch increases the responsivity and the common mode noise rejection of the sense circuit. As the flip-flop of the latch is activated via the differential switch of the differential sense amplifier, the feed-back circuit in connection with the clamping element prevents the two flip-flop transistors of the latch from being switched off together. The connection of the flip-flop transistor of the latch on the output side to a further transistor to form a current switch ensures, that, in spite of the asymmetrical control of the output driver; the flip-flop of the latch is only subjected to a minimum load by the output stage. Thus, the intermediate storage flip-flop of the latch is fully symmetrical so that optimum stability and operation are ensured.

DESCRIPTION OF THE DRAWINGS

These and other features of the present invention will be more fully appreciated and understood by considering the following description taken in conjunction with the accompanying drawing in which.

Figure 1:
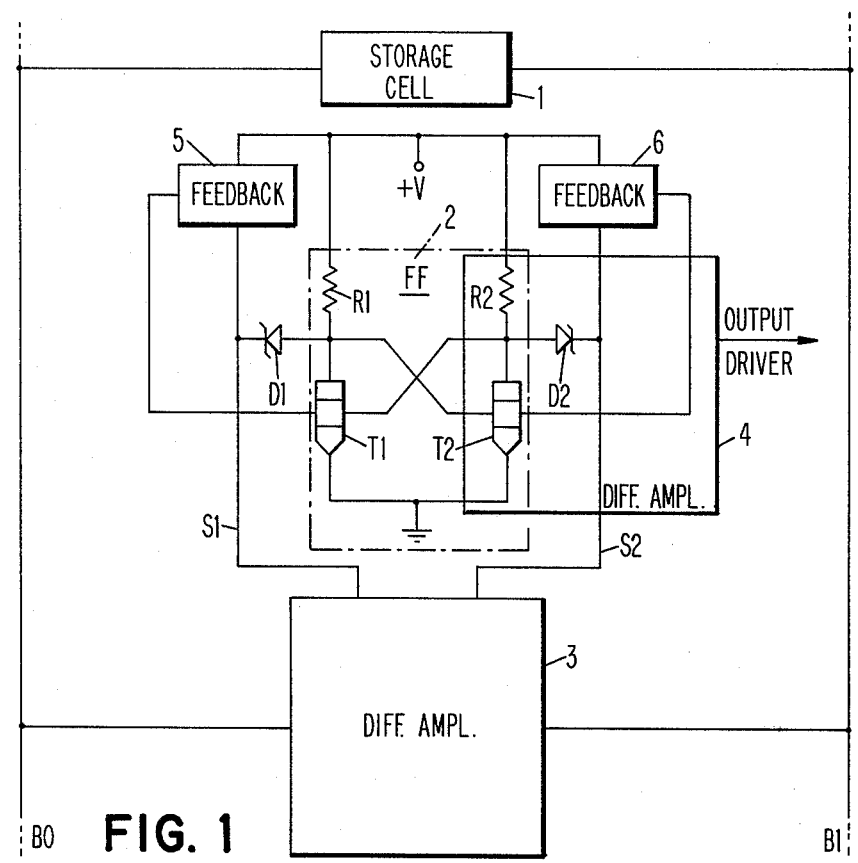
FIG. 1 is a block diagram of the sense circuit in accordance with the invention.

Referring to the drawings in more detail, the block diagram of FIG. 1 shows only a part of the storage matrix arranged on a semiconductor chip, namely, a bit line pair B1, B0 with a connected storage cell 1 and the sense circuit in accordance with the invention. Storage cell 1, for example, can be a cross-coupled transistor flip-flop with each of the bases of the two flip-flop transistors, i.e., the two cell nodes, coupled to a respective one of the two bit lines B0 or B1 via coupling elements. During a sense operation a differential signal depending upon the respective switching stage of the storage cell flip-flop is applied to the bit line pair. The actual design of the individual storage cells and the organization of the storage is of secondary importance to the function of the sense circuit in accordance with the invention.

The remaining part of the circuit shown in FIG. 1 concerns the sense circuit in accordance with the invention. This sense circuit generally comprises a latch 2, coupled to a first differential amplifier 3, by sense lines S1 and S2, a second differential amplifier 4, coacting with the latch 2 and coupled to an output driver and a pair of shunt feed-back circuits 5 and 6 also coupled to the sense lines S1 and S2. By means of this sense circuit the differential signal applied to the bit line pair is sensed, amplified, temporarily stored, and transferred to control or evaluation circuits outside the semiconductor chip via the output driver. The whole sense circuit including the output driver is usually integrated on the semiconductor chip containing the storage matrix. The sense circuit comprises a first differential amplifier 3 comprising, as will be described below by means of FIG. 2, of an emitter-coupled current switch coupled to the bit lines B0 and B1. The differential signal carried on the bit line pair is fed to the two control inputs of this differential amplifier. The sensed differential signal from the storage cell, initially consists of a differential voltage and is transformed into a corresponding differential current signal in the differential amplifier 3 and fed to a pair of output sense lines S1 and S2. The latch circuit 2 comprises a flip-flop and is used to store the sensed signal and to transmit it at a given time to the output driver. In the present example the flip-flop of the latch is basically a normal cross-coupled transistor flip-flop comprising two flip-flop transistors T1 and T2 in whose collector circuit load resistors R1 and R2 are arranged. Via a Schottky diode D1, the sense line S1 is connected to the collector of flip-flop transistor T1 and to the base of flip-flop transistor T2, whereas via a Schottky diode D2, sense line S2 is connected to the collector of flip-flop transistor T2 and to the base of flip-flop transistor T1.

A feature of the sense circuit in accordance with the invention concerns these two load resistor R1 and R2 which simultaneously form the load elements of the latch and the first differential amplifier 3. The two feed-back circuits 5 and 6 shunt the load resistors R1 and R2, respectively, and are connected to the base of the respective associated flip-flop transistor T1 or T2 and constitute a further feature.

Figure 3:
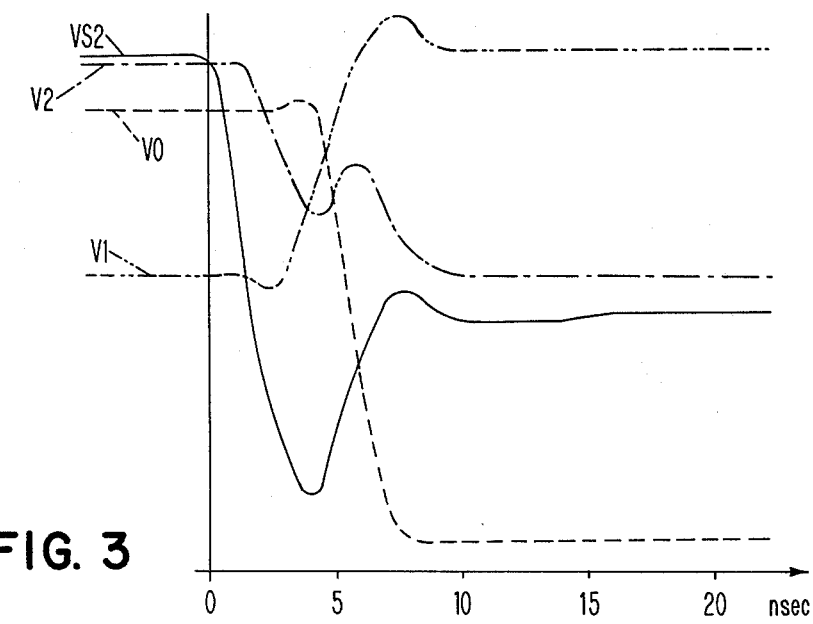
FIG. 3 shows the voltage/time diagrams of the sensing circuit of FIG. 2.

The typical function to be described in detail by means of the complete circuit in accordance with FIG. 3 consists in that the differential currents, occurring on the two sense lines S1 and S2 during sensing, control the flip-flop of the latch 2 thus determining its switching state. In other words, the flip-flop of the latch 2 is symmetrically controlled by differential amplifier 3 and has common load resistors R1 and R2 with the latter. This combination ensures a high speed and low power dissipation and noise rejection rates. In addition, its saves a further differential amplifier and ensures high common mode noise rejection and automatic level transfer. The two feedback circuits 5 and 6 are controlled in such a manner that they conductively shunt that load resistor R1 or R2 whose flip-flop transistor is conductive, whereas the other feed-back circuit is not conductive. During a switching step of the flip-flop of the latch 2, the feedback circuit associated with the flip-flop transistor becoming conductive is simultaneously switched to the conductive state. After switching, the respective conductive feedback circuit receives the sense current of the respective sense line S1 or S2. Because of the feedback effect this operation ensures an extremely high switching speed for the flip-flop of the latch 2. In addition, feedback circuits 5 and 6 integrated in the flip-flop of the latch 2 lead to a stale operation of this current controlled flip-flop, particularly since the input voltage of this flip-flop can be set to a particular voltage via the feedback circuits.

A further feature of the sense circuit, in accordance with the invention, uses flip-flop transistor T2, of the flip-flop of the latch 2, on the output side together with a further transistor (not shown in FIG. 1) to form the second differential amplifier 4 which is designed as an emitter-coupled current switch such that the further transistor is non-conductive when the flip-flop transistor T2 is conductive and is conductive when flip-flop transistor T2 is nonconductive. The output driver is thus controlled via differential amplifier 4 coupled to the latch 2. The advantages of this arrangement will be apparent from the following. In order to ensure that the latch 2 functions satisfactorily even at a lower power dissipation rae, it should be symmetrically controlled and sensed. Symmetrical sensing, on the other hand, would normally require a further differential amplifier, which would lead to a greater delay and additional power dissipation. The specifically designed differential amplifier 4, which operates on the current switch principle and is coupled to the latch 2, ensures that the load to which the latch 2 is subjected by the output driver is negligible and that the latch remains highly responsive to the control signal applied to its two inputs. The whole circuit operates at minimum delay and power dissipation.

Figure 2:
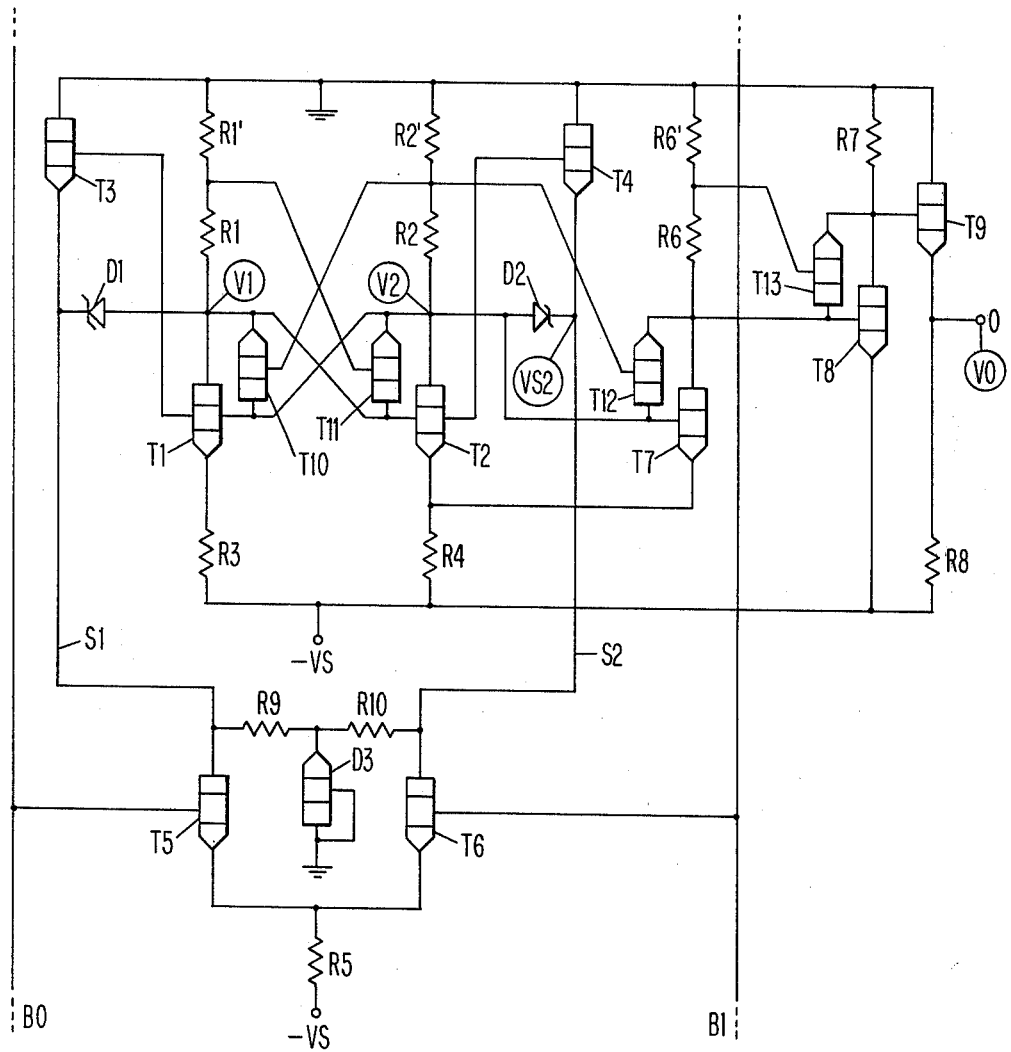
FIG. 2 illustrates in schematic form, a sensing circuit in accordance with the invention.

The design of the circuit and its operation will be described in detail below by means of a complete circuit, as shown in FIG. 2. Of the storage matrix only the bit line pair B0, B1 is shown. This bit line pair carries the sense signal in the form of a voltage difference between them. The actual sense amplifier 3 comprises transistors T5 and T6 whose emitters are connected to each other and to a constant current source made up of a common emitter resistor R5 connected to the negative pole of an operating voltage source VS. The base of transistor T5 is coupled to bit line B0, and the base of transistor T6 to bit line B1. The collectors of the two transistors T5 and T6 are connected to respective sense lines S1 and S2. In addition, the two collectors are connected, via respective resistors R9 and R10 and a common transistor D3, connected as a diode, to ground. This emitter-coupled current switch operates in such a manner that the sum of the currents flowing across both collector outputs is constant in any operating mode. In the case of the proposed application, the full current rate is carried either by transistor T5 or transistor T6 as a result of the differential control signal applied via bit lines B0 and B1. The voltage on the collectors is set via diode D3 and the two resistors R9 and R10.

In further detail, the latch 2, storing the sense signal, comprises, as described above, the two flip-flop transistors T1 and T2 whose bases are connected in each case to the collector of the other transistor. Resistors R1, R1' and R2, R2' serve as respective load elements and are connected to the respective collectors of transistors T1 and T2. Resistors R3 and R4 arranged in the respective emitter circuits of the two transistors T1 and T2 ensure the symmetry of the flip-flop and couple the emitters of transistors T1 and T2 to the negative pole of the operating voltage source VS. Resistor R4 arranged in the emitter circuit of flip-flop transistor T2 on the output side also forms, in conjunction with a further transistor T7, a further emitter-coupled current switch. The two transistors T3 and T4 which are variable impedances serve as variable impedances feedback circuits 5 and 6 respectively. The collector-base path of transistor T3 is connected parallel to load resistors R2, R2', whereas the collector-base path of transistor T4 is arranged parallel to load resistors R1, R1'. The base of feedback transistor T3 is connected to the base of flip-flop transistor T1. Correspondingly, the base of feedback transistor T4 is connected to the base of flip-flop transistor T2. The emitters of the two feedback transistors T3 and T4 are additionally connected to the associated sense lines S1 and S2. This arrangement of the two feedback transistors T3 and T4 ensures that the conductivity of these transistors always corresponds to the conductivity of the associated flip-flop transistor and is switched simultaneously during a switching step. When the flip-flop is switched, the feedback transistors produce a feedback effect in that they shunt the load resistance of the flip-flop transistor to be switched to the conductive state. In this manner, the switching process is sped up considerably. After the flip-flop has been switched, the sense current of the associated sense line S1 and S2, respectively, is fed to the conductive feedback transistor T3 or T4. Each of the two sense lines S1, S2 is connected to the collector of the associated flip-flop transistor T1, T2 via a Schottky diode D1, D2. By means of these diodes, the response threshold of the flip-flop can be suitably set.

The switching state of the flip-flop is sensed via an output driver, by using a second differential amplifier circuit which utilizes flip-flop transistor T2 on the output side and a further transistor T7. the emitter of the further transistor T7 is linked with the emitter of flip-flop transistor T2, so that resistor R4 serves as a common emitter resistor. The collector of flip-flop transistor T2 is connected to the base of the further transistor T7. Resistors R6 and R6' are arranged as load elements in the collector circuit of the further transistor T7. The two transistors T2 and T7 thus also form an emitter-coupled current switch, the collector-base connection of the two transistors ensuring that the constant current flowing across the common emitter resistor R4 flows either through the conductive flip-flop transistor T2 or through the further transistor T7. This circuit arrangement prevents an output driver connected to the collector output of transistor T7 from reacting on the flip-flop of the latch. This means, the output driver does not subject the flip-flop to any loads. This, in turn, ensures the symmetry of and an extremely high switching speed of the flip-flop of the latch, although to reduce the power requirements, extremely low operating and control voltages have to be employed.

In the embodiment described a transistor T8 with a connected emitter follower T9, which is operated as a common-emitter circuit, is used as an output driver. To this end, the base of transistor T8 is connected to the collector of transistor T7. The base of transistor T9 forming the emitter follower is connected at the junction of the collector of transistor T8 and the collector resistor R7 of transistor T8. The output 0 is taken at the junction of the emitter of transistor T9 and the emitter resistor R8. Transistor T8 serves to amplify the sense signal in a known manner, whereas the emitter follower with transistor T9 ensures a low-resistance output.

To prevent the two flip-flop transistors T1 and T2, the further transistor T7, and transistor T8 from being driven into saturation, additional transistors T10, T11, T12, and T13 can be provided. In each case, the emitter of the saturation preventing transistor is connected to the collector and the collector is connected to the base of the transistor that is not to be driven into saturation. The bases of the saturation preventing transistors are connected to circuit nodes carrying suitable control voltages. Thus the base of transistor T10 on flip-flop transistor T1 is connected to the common connection of the two load resistors R2 and R2' of the other flip-flop transistor T2. Correspondingly, the base of transistor T11 is connected to load resistors R1 and R1' of flip-flop transistor T1. The base of transistor T12 is also linked with the common connection of the two resistors R2 and R2'. The base of transistor T13 is connected to the common connection of load resistors R6 and R6' of transistor T7.

Additional information on the operation of the sense circuit is contained in the voltage/time diagrams of FIG. 3 and shows the voltage paths in the essential circuit nodes as a funtion of time, without taking into account the absolute voltage levels. It is assumed that the flip-flop of the latch is set so that flip-flop transistor T1 is conductive and flip-flop transistor T2 is not conductive. In this switching state, the potential on bit line B0 is more positive than on bit line B1. This means that transistor T5 is conductive and that the sense current flows via sense line S1 and the conductive feedback transistor T3 to the positive pole of the operating voltage source, in the example described to ground. Transistors T2, T6, T4 and T8 are non-conductive. Transistor T7 forming a current switch together with flip-flop T2 is conductive; so is transistor T9 forming the emitter follower. Thus the potential V1 on the collector of flip-flop transistor T1 is more negative than the potential V2 on the collector of flip-flop transistor T2. With transistor T9 being conductive, a relatively positive potential V0 is present on output 0. in the following, reference will be made to a sense process during which bit line B1 assumes a more positive potential than bit line B0. This means that a switching operation of the flip-flop is triggered. The more positive potential on bit line B1 influences the base of transistor T6 in such a manner that the latter transistor takes over the current that previously flowed across transistor T5, feeding it to sense line S2. In FIG. 3, the beginning of the switching process is marked by the time zero. As may be seen from FIG. 3, the potential VS2 on the emitter of transistor T4 is reduced to more negative values during roughly the first four nanoseconds. Simultaneously, potential V2 on the collector of the initially nonconductive flip-flop transistor T2 is lowered via diode D2. As a result of the cross-coupling, the same potential curve occurs on the base of the initially conductive transistor T1. Thus the sense current in sense line S2 leads to flip-flop transistor T1 being switched into the nonconductive state and to flip-flop transistor T2 being switched into the conductive state. Potential V1 on the collector of flip-flop transistor T1 and on the base of flip-flop transistor T2, respectively, assumes more positive values, so that the base voltage on feedback transistor T4 increases, too. Thus feedback transistor T4 becomes conductive, affecting a feedback to sense line S2. As the flip-flop of the latch is being switched, the voltage curve on sense line S2 which was initially negative suddenly returns to a positive value. Thus feedback transistor T4 acts similar to an emitter follower, taking over the sense current on sense line S2 after the flip-flop of the latch has been switched. Feedback transistor T3 becomes non-conductive together with flip-flop transistor T1. As the flip-flop transistor T2 becomes conductive current switching action causes transistor T7 to be turned off and becomes nonconductive and turn on transistor T8 which now becomes conductive. The turning on of transistor T8 causes the base and emitter of transistor T9 to go negative so that the output signal also goes negative. By suitably dimensioning transistors T1, T2, and T7 as well as resistors R3 and R4, identical voltage levels will appear on the emitters of transistors T1 and T2 to ensure the symmetry of the flip-flop of the latch. As previously mentioned, transistors T10 to T13 prevent the associated transistors from being driven into saturation. Transistors T10 and T13 can also be replaced by Schottky diodes. Diodes D1 and D2 serve to set the threshold voltage of the flip-flop. Corresponding operating steps result when the flip-flop of the latch is switched back to the initial state.

While the invention has been particularly shown and described with reference to the preferred embodiment thereof, it will be understood by those skilled in the art that numerous changes in form and detail of the circuit may be made therein without departing from the spirit and scope of the invention.

What is claimed is:

1. A sensing circuit comprising,
   a differential amplifier having means for receiving differential input signals and a pair of means for producing differential output signals,
   means for producing a latched operation coupled to said output signal producing means, said latched operation producing means including a first and second load element means, said first load element means coupled to one of said output signal producing means and said second load element means coupled to the other of said output signal producing means,
   first and second variable impedance feedback circuit means, each having a control element, said first variable impedance feedback circuit means being connected in parallel with said first load element means said second impedance feedback circuit means being connected in parallel with said second load element means and each of said control elements being coupled to and controlled by said latched operating producing means, and
   means for driving an output from said latched operation producing means.

2. A sensing circuit as set forth in claim 1 wherein said means for producing a latched operation further includes,
   first, second and third control devices each having an input electrode, the input electrode of said second control device being coupled to one of said pair of output signal producing means and the input electrode of said first and third control devices being coupled to the other of said output signal producing means, and
   a constant current source coupled to said second and third control devices.

3. A sensing circuit as set forth in claim 2 wherein said means for driving an output is coupled to said third control device.

4. A sensing circuit comprising
   a differential amplifier having a pair of means for receiving differential signals and having a pair of differential signal outputs,
   a latch, having a pair of inputs coupled to respective ones of said pair of differential signal outputs,
   a reference voltage,
   a pair of load elements connected between respective ones of said inputs and said reference voltage,
   a pair of feedback elements coupled to said latch, and each of said feedback elements is connected between a respective one of said differential amplifier outputs and said reference voltage, and
   output means coupled to said latch.

5. The sensing circuit of claim 1 wherein there is further provided a voltage source, and
   said means for producing a latched operation further includes
   a pair of transistors each of which has an emitter, a base and a collector, and each of said collectors is connected to a respective one of said load elements means, coupled to a respective one of said output signal producing means and cross-coupled to the base of the other of said pair of transistors, and each of said emitters is coupled through respective emitter resistors to said voltage source.

6. The sensing circuit of claim 5 wherein said means for producing a latched operation further includes a further transistor having a base, an emitter and a collector, and
   a reference voltage,
   said further transistor having its emitter coupled to the emitter of one of said cross-coupled transistors, its base coupled to the collector of said one of cross-coupled transistors and its collector coupled to said reference voltage and coacting with said one of said cross-coupled transistors to form a current switch.

7. The sensing circuit of claim 6 wherein each of said feedback circuit means comprises a transistor having a base, an emitter and a collector, and each of said bases is coupled to a respective base of respective one of said cross-coupled transistors, each of said emitters is connected to a respective output signal producing means and each of said collectors is connected together and to said reference voltage.

8. The sensing circuit of claim 7 wherein said means for driving an output comprises an output line and a drive circuit composed of an emitter coupled transistor coupled to said output line and a drive transistor coupled to said further transistor and said emitter coupled transistor.

9. The sensing circuit of claim 6 wherein said means for producing a latched operation further includes a pair of diodes, each of said pair of diodes coupling said latch means to respective ones of said output signal producing means.

10. The sensing circuit of claim 5 wherein said means for producing a latched operation further includes clamping devices coupled between the base and collector of each of said cross-coupled transistors.

11. The sensing circuit of claim 9 wherein there is provided a clamping device coupled between the base and the collector of said further transistor.

12. The sensing circuit of claim 6 wherein said differential amplifier comprises a pair of bipolar transistors, each transistor having a base, an emitter and a collector, each transistor having its base connected to a respective signal input, its emitter coupled through an emitter resistor to said voltage source and its collector coupled through a respective collector resistor and a diode to said reference voltage.

* * * * *

UNITED STATES PATENT OFFICE
CERTIFICATE OF CORRECTION

PATENT NO. : 4,027,176
DATED : May 31, 1977
INVENTOR(S) : KLAUS HEUBER ET AL

It is certified that error appears in the above—identified patent and that said Letters Patent are hereby corrected as shown below:

Claim 5, column 8, line 45    Delete "elements" insert --element--

Signed and Sealed this

Eleventh Day of October 1977

[SEAL]

Attest:

RUTH C. MASON
*Attesting Officer*

LUTRELLE F. PARKER
*Acting Commissioner of Patents and Trademarks*